(12) United States Patent
Lee et al.

(10) Patent No.: US 12,270,987 B2
(45) Date of Patent: Apr. 8, 2025

(54) WINDOW ASSEMBLIES, IMAGING SYSTEM INCLUDING THE SAME, METHOD OF MANUFACTURING THE IMAGING SYSTEM, AND ELECTRONIC APPARATUS INCLUDING THE IMAGING SYSTEM

(71) Applicant: SAMSUNG ELECTRONICS CO., LTD., Suwon-si (KR)

(72) Inventors: Duhyun Lee, Yongin-si (KR); Jinmyoung Kim, Hwaseong-si (KR); Byonggwon Song, Seoul (KR); Yooseong Yang, Yongin-si (KR); Byungkyu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 283 days.

(21) Appl. No.: 17/724,124

(22) Filed: Apr. 19, 2022

(65) Prior Publication Data
US 2023/0111183 A1     Apr. 13, 2023

(30) Foreign Application Priority Data
Oct. 8, 2021    (KR) .................. 10-2021-0134457

(51) Int. Cl.
*G02B 26/06*    (2006.01)
*G02B 26/02*    (2006.01)
*H01L 23/00*    (2006.01)
*H01L 27/146*   (2006.01)

(52) U.S. Cl.
CPC ............. *G02B 26/06* (2013.01); *G02B 26/02* (2013.01); *H01L 24/81* (2013.01); *H01L 27/14618* (2013.01); *H01L 27/14685* (2013.01); *H01L 24/16* (2013.01); *H01L 27/14649* (2013.01); *H01L 2224/16238* (2013.01); *H01L 2224/8113* (2013.01); *H01L 2224/81132* (2013.01); *H01L 2224/81169* (2013.01)

(58) Field of Classification Search
None
See application file for complete search history.

(56) References Cited

U.S. PATENT DOCUMENTS

| | | | |
|---|---|---|---|
| 10,440,244 B2 | 10/2019 | Rosenblatt et al. | |
| 10,495,793 B2 | 12/2019 | Gill | |
| 2007/0120060 A1* | 5/2007 | Lane | H01L 31/0232 |
| | | | 250/353 |
| 2016/0241799 A1* | 8/2016 | Gill | G02B 5/1871 |
| 2020/0098814 A1 | 3/2020 | Yang | |
| 2021/0028215 A1 | 1/2021 | Devlin et al. | |

FOREIGN PATENT DOCUMENTS

| CN | 110972505 A | 4/2020 |
|---|---|---|
| CN | 211979329 U | 11/2020 |

* cited by examiner

*Primary Examiner* — Hung K Vu
(74) *Attorney, Agent, or Firm* — Sughrue Mion, PLLC

(57) ABSTRACT

A window assembly includes a transparent window layer and a first coded mask layer provided on a first surface of the window layer, the first coded mask layer having a first shape configured to change a first property of light passing through the window assembly. The first coded mask layer may include a meta-surface including a phase modulation meta-pattern. The meta-surface may further include an amplitude modulation meta-pattern. A second coded mask layer having a second shape configured to change a second property of the light passing through the window assembly may further be provided on a second surface of the window layer.

17 Claims, 13 Drawing Sheets

WINDOW ASSEMBLIES, IMAGING SYSTEM INCLUDING THE SAME, METHOD OF MANUFACTURING THE IMAGING SYSTEM, AND ELECTRONIC APPARATUS INCLUDING THE IMAGING SYSTEM

CROSS-REFERENCE TO RELATED APPLICATION

This application is based on and claims priority under 35 U.S.C. § 119 to Korean Patent Application No. 10-2021-0134457, filed on Oct. 8, 2021, in the Korean Intellectual Property Office, the disclosure of which is incorporated by reference herein in its entirety.

BACKGROUND

1. Field

The disclosure relates to imaging systems, and more particularly, to window assemblies, imaging systems including the same, a method of manufacturing the imaging systems, and electronic apparatuses including the imaging systems.

2. Description of Related Art

An imaging system generally includes an image sensor chip including a driving circuit, a packaging covering the image sensor chip, a light incident window in the packaging, a wavelength filter above the light incident window, and a lens system above the packaging. Materials of the window and the lens may have an appropriate transmittance and refractive index for light.

Recently, a lensless imaging system has been introduced. A lensless imaging system does not use a lens that is used in an imaging system of the related art. In the case of an existing imaging system, because a lens is provided, a space necessary for light to travel, that is, a space corresponding to at least a focal length of the lens, is required. Because a lensless imaging system does not use a conventional lens, it does not require a space for light to travel. Therefore, the lensless imaging system may have a reduced volume compared to the imaging system of the related art. Therefore, by using a lensless imaging system, a compact imaging system may be implemented.

SUMMARY

Provided are window assemblies capable of restoring a desired image.

Provided are imaging systems having a compact size by including the window assemblies.

Provided are methods of manufacturing the imaging systems.

Provided are electronic apparatuses including the imaging systems.

Additional aspects will be set forth in part in the description which follows and, in part, will be apparent from the description, or may be learned by practice of embodiments of the disclosure.

In accordance with an aspect of the disclosure, a window assembly includes a transparent window layer; and a first coded mask layer provided on a first surface of the transparent window layer, the first coded mask layer having a first shape configured to change a first property of light passing through the window assembly.

The first coded mask layer may include a meta-surface including a phase modulation meta-pattern.

The meta-surface may further include an amplitude modulation meta-pattern.

The window assembly may further include a second coded mask layer provided directly on a second surface of the transparent window layer, the second coded mask layer having a second shape configured to change a second property of the light passing through the window assembly.

Both the first and second coded mask layers may include phase modulation coded mask layers.

Each of the first and second coded mask layers may include a respective plurality of phase modulation meta-patterns.

One of the first and second coded mask layers may include a phase modulation coded mask layer, and the other one of the first and second coded mask layers may include an amplitude modulation coded mask layer.

The phase modulation coded mask layer may include a plurality of phase modulation meta-patterns, and the amplitude modulation coded mask layer comprises a plurality of amplitude modulation meta-patterns.

The window assembly may further include a filter layer and an anti-reflection film sequentially stacked on a second surface of the transparent window layer, the second surface being opposite to the first surface.

The window assembly may further include a filter layer and an anti-reflection film sequentially stacked on the second coded mask layer.

The first and second coded mask layers may both include phase modulation coded mask layers, and an amplitude modulation coded mask layer may be further provided on the second coded mask layer.

The window assembly may further include a light separation layer between the first surface of the transparent window layer and the first coded mask layer.

The transparent window layer may be transparent to long-wavelength infrared (LWIR) rays, and the first coded mask layer may include a plurality of meta-patterns that change a phase of the LWIR rays, and the plurality of meta-patterns may be configured to restore an image included in the light passing through the window assembly.

The transparent window layer may include a silicon layer, and the plurality of meta-patterns may include an amorphous silicon pattern.

An imaging system may include the window assembly of an above-noted aspect of the disclosure that does not comprise a lens; and an image sensor configured to receive light passing through the window assembly and generate an electrical signal for generating an image.

The image sensor may include a complementary metal oxide semiconductor (CMOS) image sensor.

In accordance with an aspect of the disclosure, a method of manufacturing an imaging system includes forming an image sensor on a substrate; forming first bumps on the substrate around the image sensor; forming a first coded mask layer on a first surface of a window layer; forming second bumps on the first surface around the first coded mask layer; sequentially forming a filter layer and an anti-reflection film on a second surface of the window layer opposite to the first surface; aligning the substrate and the window layer so that the first bumps and the second bumps face each other and the image sensor and the first coded mask layer face each other; and contact bonding the first and second bumps to each other by moving the window layer until the image sensor and the first coded mask layer have a given distance while maintaining the alignment.

The method may further include forming a transparent light separation layer between the first surface of the window layer and the first coded mask layer.

The method may further include forming a second coded mask layer between the second surface of the window layer and the filter layer.

The forming of the first coded mask layer may include forming a meta-surface including a plurality of meta-patterns that change a phase of LWIR rays.

The meta-surface may further include another plurality of meta-patterns that change an amplitude of the LWIR rays.

The first coded mask layer and the second coded mask layer may both include a phase modulation coded mask layer.

One of the first coded mask layer and the second coded mask layer may include a phase modulation coded mask layer, and the other one of the first coded mask layer and the second coded mask layer may include an amplitude modulation coded mask layer.

The method may further include forming an amplitude modulation coded mask layer on the second surface.

The window layer may include a silicon layer, and the first coded mask layer may include a plurality of amorphous silicon patterns.

An electronic apparatus may include the imaging system of an above-noted aspect of the disclosure, wherein the imaging system is configured to generate the image of an object.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
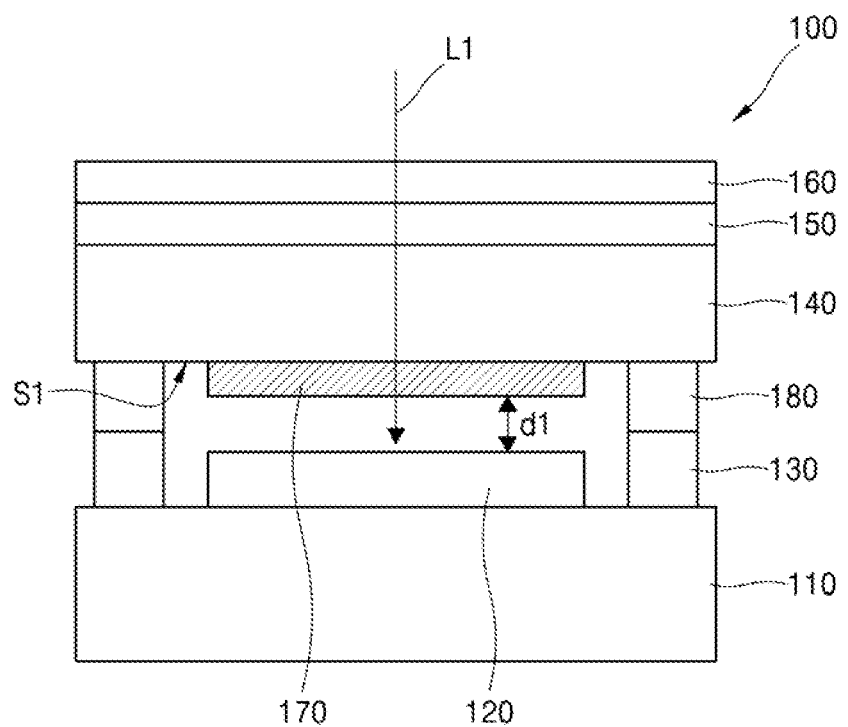
FIGS. 1 to 6 are cross-sectional views illustrating imaging systems according to embodiments.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a window assembly, an imaging system including the same, a method of manufacturing the imaging system, and an electronic apparatus including the imaging system according to example embodiments will be described in detail with reference to the accompanying drawings. In the following description, thicknesses of layers and regions in the drawings may be exaggerated for clarity of the specification. In addition, the embodiments of the disclosure may be variously modified and may be embodied in many different forms. In addition, in a layer structure described below, when an element or layer is referred to as being "on" or "above" another element or layer, the element or layer may be directly on another element or layer or intervening elements or layers. In the description below, like reference numerals in each drawing indicate like elements.

First, imaging systems according to example embodiments will be described, and a window assembly is also described in this process.

FIG. 1 shows a first imaging system 100 according to an example embodiment.

Referring to FIG. 1, the first imaging system 100 includes a substrate 110, an image sensor 120, a window layer 140, a filter layer 150, and an anti-reflection film 160, which are sequentially stacked on the substrate 110. The first imaging system 100 may not include a lens system of the related art. The image sensor 120 is electrically connected to the substrate 110. The window layer 140 and the image sensor 120 are parallel to each other, face each other, and are separated from each other. The filter layer 150 may cover an upper surface of the window layer 140 and may be in direct contact with the upper surface of the window layer 140. The anti-reflection film 160 may be in direct contact with the filter layer 150. A first coded mask layer 170 is provided on a first surface (e.g., bottom surface) S1 of the window layer 140 facing the image sensor 120. For example, the first coded mask layer 170 may replace an existing lens or lens system. The first coded mask layer 170 is provided parallel to the window layer 140 and the image sensor 120. The first coded mask layer 170 may be arranged to directly face the image sensor 120. The first coded mask layer 170 and the image sensor 120 may be separated from each other by a first distance d1 in a first direction. The first direction may be a direction in which the window layer 140 is perpendicular to the first surface S1. For example, the first distance d1 may be in a range from about 5 mm to about 500 μm.

Although described later, the first coded mask layer 170 may include a pattern having a specific shape (e.g., a first shape) having information necessary for image restoration. Because the information about the specific type of a pattern included in the first coded mask layer 170 may be related to phase information (e.g., a first property) of incident light, the information about the specific type of the pattern may be used in a process of restoring an initial image generated by the image sensor 120 into a final image. A restoration algorithm may be used for the restoration. The final image may be a two-dimensional (2D) or three-dimensional (3D) image of an object to be obtained.

The pattern included in the first coded mask layer 170 may be a pattern for changing the transmittance of light passing through the first coded mask layer 170 or a pattern for changing the phase of transmitted light. As described above, because the first coded mask layer 170 includes a pattern that may change the phase of incident light, light passing through the first coded mask layer 170 may be dispersed or scattered and enter the image sensor 120.

Unlike a lens system of the related art, the first coded mask layer 170 has substantially no thickness, and does not require a space required for light to travel in a lens system. Accordingly, because the first coded mask layer 170 is provided, an overall volume of an imaging system may be reduced, and a more compact imaging system may be implemented.

A first packaging bump 130 is provided on the substrate 110 around the image sensor 120. For convenience, the "packaging bump" will be referred to as "bump" hereinafter. A second bump 180 is downwardly provided at a position corresponding to the first bump 130 around the first coded mask layer 170 on the first surface S1 of the window layer 140. The first and second bumps 130 and 180 are sequentially stacked between the substrate 110 and the window layer 140 and are in contact with each other. The first and second bumps 130 and 180 may be used as alignment keys (patterns) in a manufacturing process of the imaging system 100. The first and second bumps 130 and 180 are separated from the image sensor 120 and the first coded mask layer 170.

The substrate 110 may include a circuit unit for driving and controlling the image sensor 120. For example, the circuit unit may include a readout IC (ROIC). For example, the circuit unit may be provided on the substrate 110 together with the image sensor 120. For example, the ROIC may include a memory (e.g., a buffer memory, etc.) and/or an image signal processor. The image sensor 120 converts light passing through the first coded mask layer 170 into an electrical signal and generates an image of an object. To this end, the image sensor 120 may include a photoelectric conversion element (e.g., a photodiode) and a restoration algorithm for image restoration. The restoration algorithm may be provided on the substrate 110 for driving control. The image sensor 120 may include a CMOS image sensor (CIS) or a bolometer, but is not limited thereto. The image sensor 120 may include a sensor array including a plurality of electromagnetic wave sensors. The window layer 140 may include a transparent material layer that does not absorb or substantially does not absorb incident light. A material of the window layer 140 may be selected in consideration of the type of incident light. For example, when light incident on the window layer 140 is long-wavelength infrared (LWIR) rays, the window layer 140 may include a silicon layer or a silicon wafer, but is not limited thereto. For example, when light incident on the window layer 140 is visible light, the window layer 140 may include a glass layer or a glass substrate, but is not limited thereto. A material of the first coded mask layer 170 may vary depending on the role or material of the window layer 140. For example, if the window layer 140 is prepared in consideration of LWIR rays, the first coded mask layer 170 may include an amorphous silicon layer, but is not limited thereto. For example, if the window layer 140 is prepared in consideration of visible light, the first coded mask layer 170 may include a high refractive index dielectric layer. For example, the high refractive index dielectric layer may include, but is not limited to, silicon nitride (Si nitride) or titanium nitride (Ti nitride). The filter layer 150 transmits only necessary light from incident light L1 and blocks the rest to minimize noise light as much as possible. An appropriate filter may be used for the filter layer 150 in consideration of the role or material of the window layer 140. For example, if the window layer 140 is prepared in consideration of LWIR rays, the filter layer 150 may include a filter that passes LWIR rays from the incident light L1 and blocks the rest. For example, if the window layer 140 is prepared in consideration of visible light or light of another band, the filter layer 150 may include a filter that passes light of the corresponding band and blocks the rest. The anti-reflection film 160 minimizes or prevents external reflection of the incident light L1.

Figure 2:
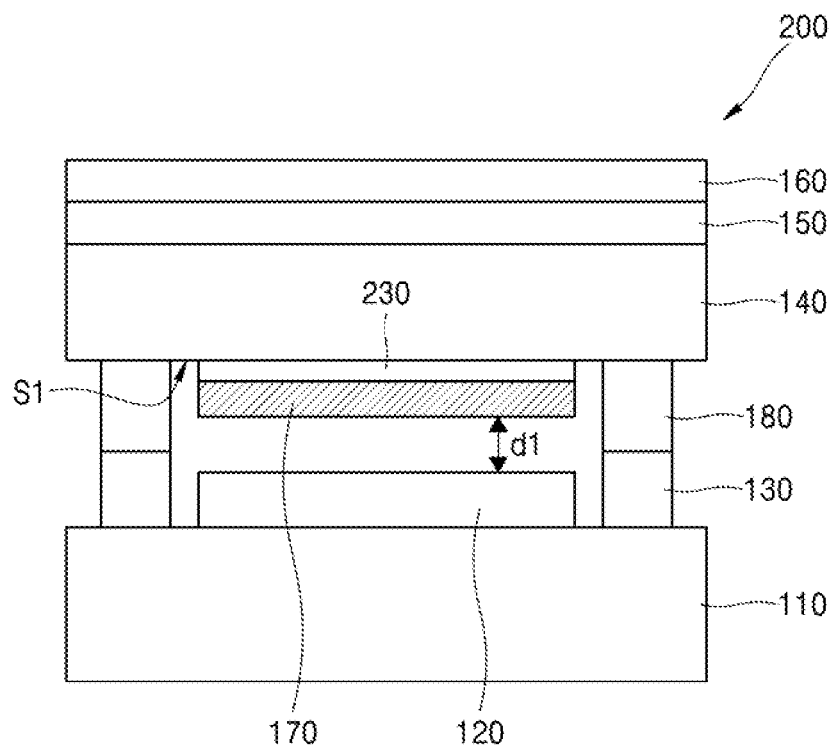

FIG. 2 shows a second imaging system 200 according to an example embodiment. Only parts different from the first imaging system 100 of FIG. 1 will be described.

Referring to FIG. 2, the second imaging system 200 includes a light separation layer 230 arranged between the window layer 140 and the first coded mask layer 170. The light separation layer 230 may be transparent to incident light. The light separation layer 230 may be interposed between the window layer 140 and the first coded mask layer 170 to be in direct contact with both layers. The light separation layer 230 may be parallel to the first surface S1 of the window layer 140. For example, the light separation layer 230 may include a silicon oxide layer (e.g., $SiO_2$), and has a lower refractive index than that of the window layer 140 and the first coded mask layer 170. Because the light separation layer 230 is provided, the light transmittance of the second imaging system 200 may be different from that of the first imaging system 100. In this regard, the light separation layer 230 may serve to optically separate the window layer 140 from the first coded mask layer 170. As a result, the first coded mask layer 170 may more effectively perform an optical function.

Figure 3:
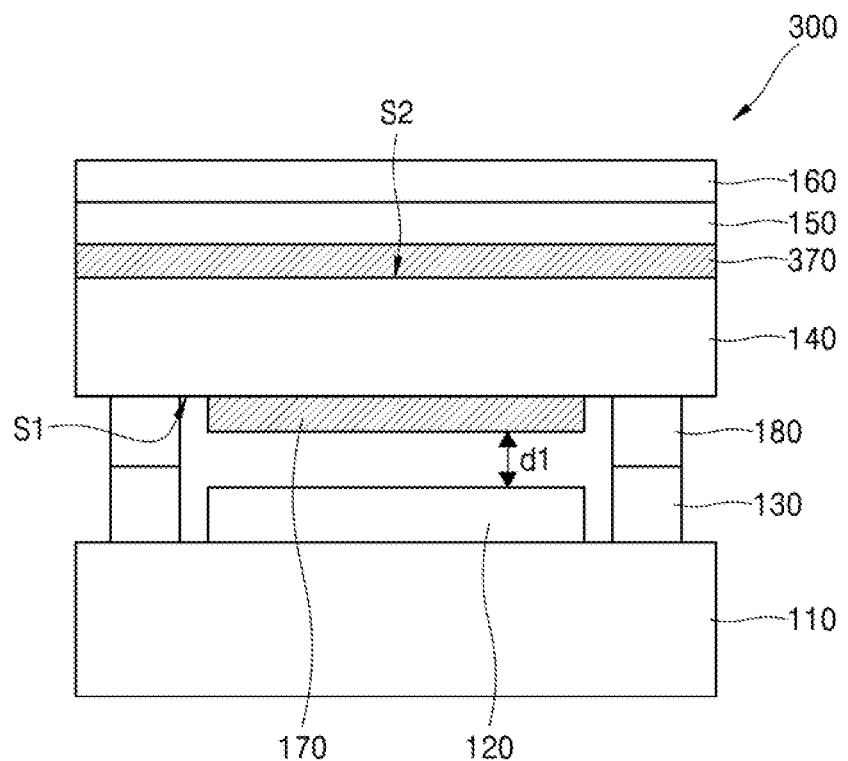

FIG. 3 shows a third imaging system 300 according to an example embodiment. Only parts different from the first imaging system 100 of FIG. 1 will be described.

As shown in FIG. 3, the third imaging system 300 includes first and second coded mask layers 170 and 370.

Specifically, the first coded mask layer 170 is provided on the first surface S1 of the window layer 140 like in the first imaging system 100. The second coded mask layer 370 is arranged to face the first coded mask layer 170 with the window layer 140 therebetween. For example, the second coded mask layer 370 is parallel to the first surface S1 of the window layer 140 and is provided on a second surface S2 of the window layer 140 facing (e.g., opposite to) the first surface S1. For example, in FIG. 3, the second surface S2 may be an upper surface of the window layer 140, but depending on the viewpoint, the second surface S2 may be a side surface or a bottom surface. The second coded mask layer 370 may cover an entire second surface S2 of the window layer 140 and may be in direct contact with the second surface S2. In other words, the second coded mask layer 370 is interposed between the window layer 140 and the filter layer 150. As a result, a stack structure in which the second coded mask layer 370, the filter layer 150, and the anti-reflection film 160 are sequentially stacked is provided on the second surface S2 of the window layer 140. For example, like the first coded mask layer 170, the second coded mask layer 370 may include a pattern for changing a phase of incident light. For example, the first and second coded mask layers 170 and 370 may include a phase modulation type pattern. This will be described later. For example, a material of the second coded mask layer 370 may be the same as that of the first coded mask layer 170.

For example, the light separation layer 230 of the second imaging system 200 of FIG. 2 may be applied to the third imaging system 300. That is, the light separation layer 230 of FIG. 2 may be provided between the first coded mask layer 170 and the first surface S1 of the window layer 140.

Figure 4:
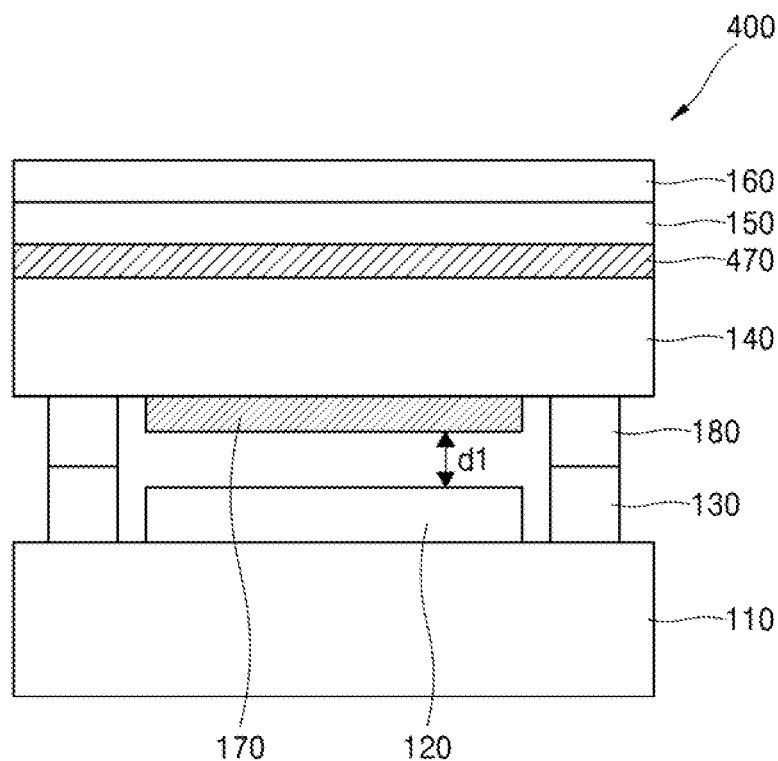

FIG. 4 shows a fourth imaging system 400 according to an example embodiment. Only parts different from the first imaging system 100 of FIG. 1 will be described.

Referring to FIG. 4, the fourth imaging system 400 includes a third coded mask layer 470 between the window layer 140 and the filter layer 150. The window layer 140 and the filter layer 150 are separated from each other due to the third coded mask layer 470. The third coded mask layer 470 may face the first coded mask layer 170 with the window layer 140 therebetween. For example, an arrangement relationship of the third coded mask layer 470 with respect to the window layer 140 and the first coded mask layer 170 may be the same as the arrangement relationship of the second coded mask layer 370 with respect to the window layer 140 and the first coded mask layer 170.

For example, the operating characteristics and material of the third coded mask layer 470 may be different from those of the first coded mask layer 170. For example, the third coded mask layer 470 may include a pattern (e.g., a second shape) that changes an amplitude (e.g., a second property) of incident light. That is, the third coded mask layer 470 may act as an amplitude modulation layer that modulates an amplitude of incident light. Accordingly, the transmittance of the incident light may be controlled by the third coded mask layer 470. Therefore, in a manufacturing process of the fourth imaging system 400, the third coded mask layer 470 may be formed so that the fourth imaging system 400 has a set transmittance in consideration of the use or purpose of the fourth imaging system 400. That is, dimensions (e.g., thickness, material, pattern shape, pattern spacing, etc.) of the third coded mask layer 470 may be determined in consideration of the use or purpose of the fourth imaging system 400. For example, the third coded mask layer 470 may include a metal layer, which may include a plurality of metal patterns provided to form a set shape. For example, the plurality of metal patterns may include a chromium pattern, but is not limited to chromium.

For example, the light separation layer 230 of the second imaging system 200 of FIG. 2 may also be applied to the fourth imaging system 400. For example, the light separation layer 230 of FIG. 2 may be provided between the first coded mask layer 170 and the first surface S1 of the window layer 140.

Figure 5:
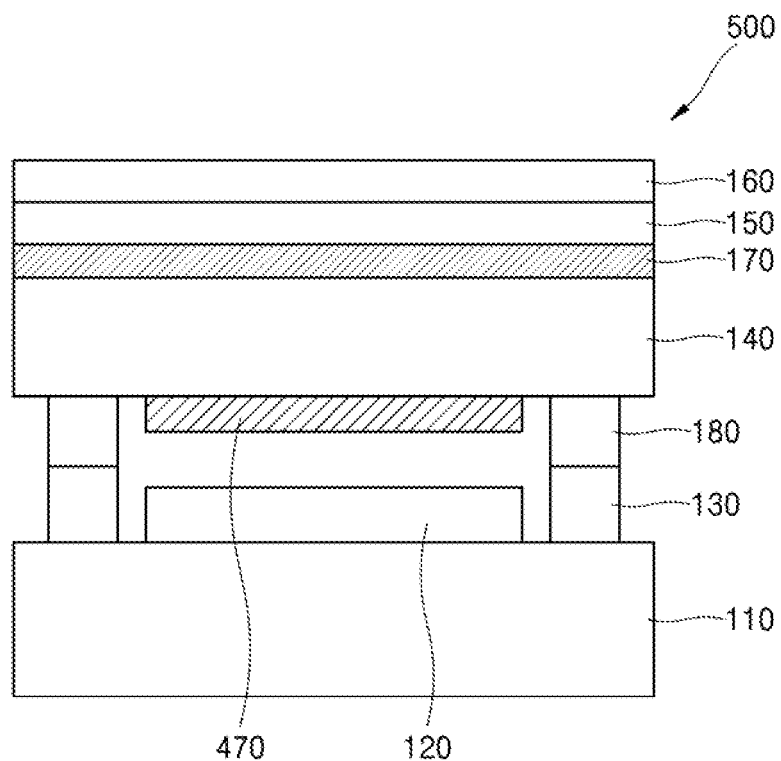

FIG. 5 shows a fifth imaging system 500 according to an example embodiment. Only parts different from the fourth imaging system 400 of FIG. 4 will be described.

Referring to FIG. 5, like the fourth imaging system 400, the fifth imaging system 500 also includes a phase modulation coded mask layer and an amplitude modulation coded mask layer at the same time. However, an arrangement relationship of the phase modulation coded mask layer and the amplitude modulation coded mask layer of the fifth imaging system 500 is opposite to that of the fourth imaging system 400. That is, in the fifth imaging system 500, the first coded mask layer 170, which is a phase modulation coded mask, is provided between the window layer 140 and the filter layer 150, and the third coded mask layer 470, which is an amplitude modulation coded mask, is provided on the first surface S1 of the window layer 140 facing the image sensor 120.

For example, the light separation layer 230 of the second imaging system 200 of FIG. 2 may also be applied to the fifth imaging system 500. For example, although not shown, the light separation layer 230 of FIG. 2 may be provided between the first coded mask layer 170 and the second surface S2 of the window layer 140 and cover an entire second surface S2. Accordingly, a stack structure in which the light separation layer 230, the first coded mask layer 170, the filter layer 150, and an anti-reflection film 160 are sequentially stacked on the second surface S2 of the window layer 140 may be provided. For example, the light separation layer 230 of FIG. 2 may be provided between the first surface S1 of the window layer 140 and the third coded mask layer 470 instead of between the window layer 140 and the first coded mask layer 170.

Figure 6:
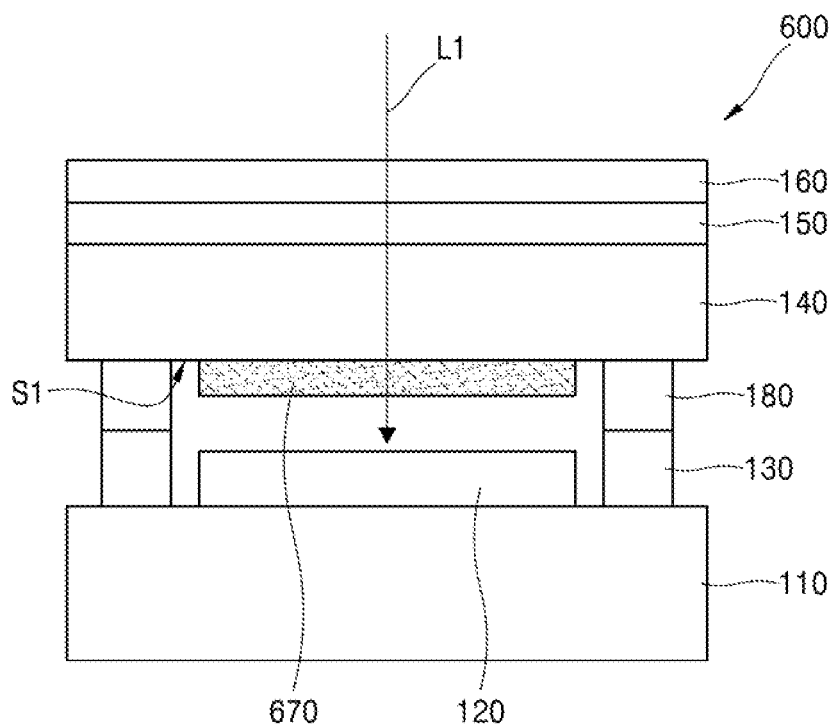

FIG. 6 shows a sixth imaging system 600 according to an example embodiment. Only parts different from the first imaging system 100 of FIG. 1 will be described.

Referring to FIG. 6, the sixth imaging system 600 includes a fourth coded mask layer 670 on the first surface S1 of the window layer 140. An arrangement relationship of the fourth coded mask layer 670 and its periphery may be the same as that of the first coded mask layer 170 and its periphery of the first imaging system 100 of FIG. 1, but may be different from each other. For example, the fourth coded mask layer 670 may be a complex coded mask layer having a complex function. For example, the fourth coded mask layer 670 may be a coded mask layer that changes (modulates) both a phase and amplitude of the incident light L1 together. For example, the fourth coded mask layer 670 may include all of a pattern characteristic of the first coded mask layer 170 that changes a phase of incident light and a pattern characteristic of the third coded mask layer 470 that changes an amplitude of the incident light. In other words, the fourth coded mask layer 670 may exhibit both a pattern characteristic of the first coded mask layer 170 and a pattern characteristic of the third coded mask layer 470. For example, the fourth coded mask layer 670 may include a plurality of patterns, and the plurality of patterns may be designed to have a set shape. The fourth coded mask layer 670 may be designed to exhibit a pattern characteristic of the first coded mask layer 170 and a pattern characteristic of the third coded mask layer 470. The plurality of patterns included in the fourth coded mask layer 670 may be a mixture of a pattern included in the first coded mask layer 170 and a pattern included in the third coded mask layer 470.

The first to sixth imaging systems 100, 200, 300, 400, 500, and 600 may be cameras for visible light or LWIR rays, but are not limited thereto.

In the first to sixth imaging systems 100, 200, 300, 400, 500, and 600, the window layer 140, at least one coded mask layer (for example, 170 of FIG. 1), the filter layer 150, and the anti-reflection film 160 may be collectively represented as a window assembly. For example, the window layer 140 and at least one coded mask layer may be collectively represented as a window assembly. The window assembly may also include the light separation layer 230 provided between the window layer 140 and the first coded mask layer 170.

Figure 7:
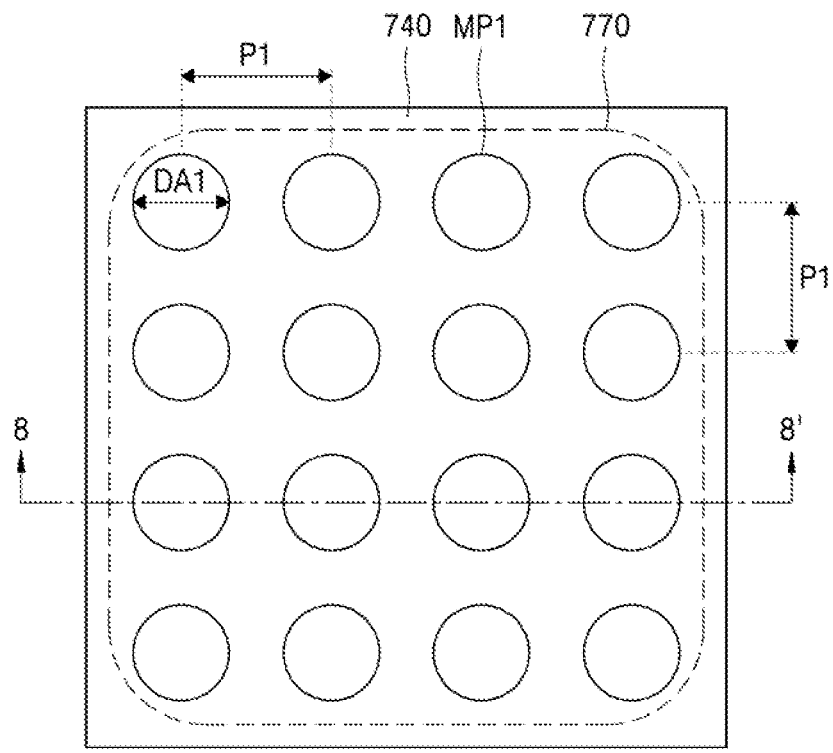
FIG. 7 is a plan view illustrating an example of a coded mask layer (meta-surface) included in a window assembly of the imaging system of FIGS. 1 to 6.
Figure 8:
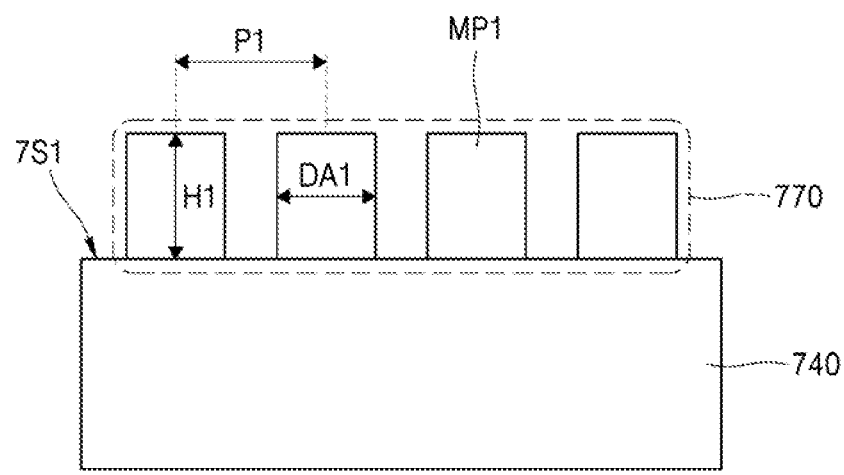
FIG. 8 is a cross-sectional view taken along line 8-8' of FIG. 7.

FIG. 7 is a plan view illustrating an example of the first to third coded mask layers 170, 370, and 470 included in the first to fifth imaging systems 100, 200, 300, 400, and 500. FIG. 8 is a cross-sectional view taken along line 8-8' of FIG. 7.

Referring to FIGS. 7 and 8 together, a meta-surface 770 is present on one surface 7S1 of a transparent substrate 740. Optical properties and material of the transparent substrate 740 may be the same as those of the window layer 140. Accordingly, the transparent substrate 740 may correspond to the window layer 140. The one surface 7S1 of the transparent substrate 740 may correspond to the first surface S1 or the second surface S2 of the window layer 140. The meta-surface 770 includes a plurality of meta-patterns MP1. Depending on a material of the plurality of meta-patterns MP1, the meta-surface 770 may correspond to one of the first to third coded mask layers 170, 370, and 470. As an example, the plurality of meta-patterns MP1 may be amorphous silicon patterns, and in this case, the meta-surface 770 may correspond to the first coded mask layer 170 and/or the second coded mask layer 370 for infrared rays (e.g., LWIR rays). For example, the plurality of meta-patterns MP1 may be silicon nitride patterns or titanium nitride patterns, and in this case, the meta-surface 770 may correspond to the first coded mask layer 170 and/or the second coded mask layer 370 for visible light. For example, the plurality of meta-patterns MP1 may be metal patterns, and in this case, the meta-surface 770 may correspond to the third coded mask layer 470 that changes the amplitude of incident light.

The plurality of meta-patterns MP1 may be arranged to form a given shape. As an example, the plurality of meta-patterns MP1 may be arranged so that a planar shape of the meta-surface 770 has a given shape, and as shown in FIG. 7, the plurality of meta-patterns MP1 may be arranged at a given interval in horizontal and vertical directions, respectively, so that the planar shape of the meta-surface 770 becomes a square. In the case of FIG. 7, intervals of the horizontal and vertical directions of the plurality of meta-patterns MP1 are illustrated to be the same, but may not be the same.

For example, each of the plurality of meta-patterns MP1 may be a nanostructure. For example, as shown in FIG. 7, the plurality of meta-patterns MP1 may be arranged to have the same pitch P1 in the horizontal and vertical directions, respectively, but may not be the same. The pitch P1 may vary according to a wavelength band of incident light, and may be less than the wavelength of the incident light. For example, when incident light is infrared ray (e.g., LWIR rays) and when a wavelength or the central wavelength of the incident light is about 10 μm, the pitch P1 may be about 5 μm. A diameter DA1 of the plurality of meta-patterns MP1 may be less than the pitch P1. A diameter DA1 of the plurality of meta-patterns MP1 may vary depending on the wavelength of incident light, and may be less than a corresponding wavelength. For example, when incident light is LWIR ray, the diameter DA1 of the plurality of meta-patterns MP1 may be 4 μm or less or in a range of about 0.3 μm to about 2 μm. For example, the pitch P1 and the diameter DA1 of a portion of the plurality of meta-patterns MP1 may be different from others.

Each of the plurality of meta-patterns MP1 may have a cylindrical shape, but is not limited thereto. A height H1 of each of the plurality of meta-patterns MP1 may be the same as or substantially the same as each other. For example, the height H1 may vary according to a wavelength of incident light, and may be less than a corresponding wavelength. For example, when incident light is LWIR ray, the height H1 may be about 5 μm, but is not limited thereto. For example, the height H1 and the pitch P1 of the plurality of meta-patterns MP1 may be the same or different from each other. As another example, the plurality of meta-patterns MP1 may have a hole shape. For example, the plurality of meta-patterns MP1 may have a shape of a pattern generated by etching a material.

In FIGS. 7 and 8, the number of the plurality of meta-patterns MP1 is shown to be a total of 16 (4×4), but this is for convenience of illustration, and the meta-surface 770 may include more meta-patterns while maintaining the morphological and distributional features. In addition, the length of the meta-surface 770 in the horizontal direction may be the same as or different from the length of the meta-surface 770 in the vertical direction.

The dimensions or morphological features of each of the plurality of meta-patterns MP1 constituting the meta-surface 770 and the distribution form (distributional features) of the plurality of meta-patterns MP1 may be phase or transmittance pattern information that may be recognized by a restoration algorithm used to restore a digital image generated by the image sensor 120 to an image of an object.

Figure 9:
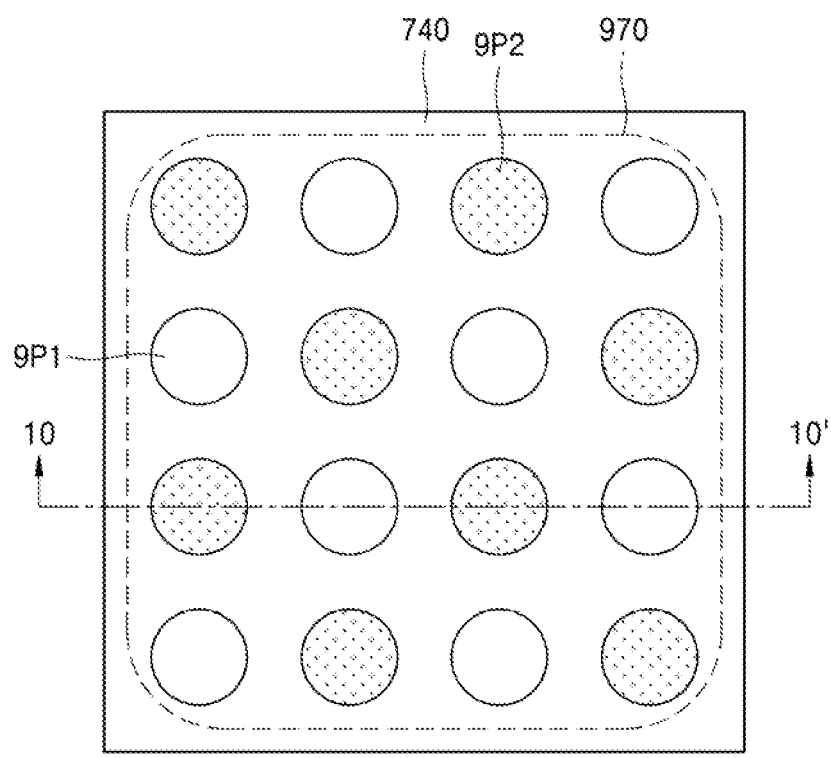
FIG. 9 is a plan view illustrating an example of a coded mask layer (meta-surface) included in the window assembly of the imaging system of FIGS. 1 to 6.
Figure 10:
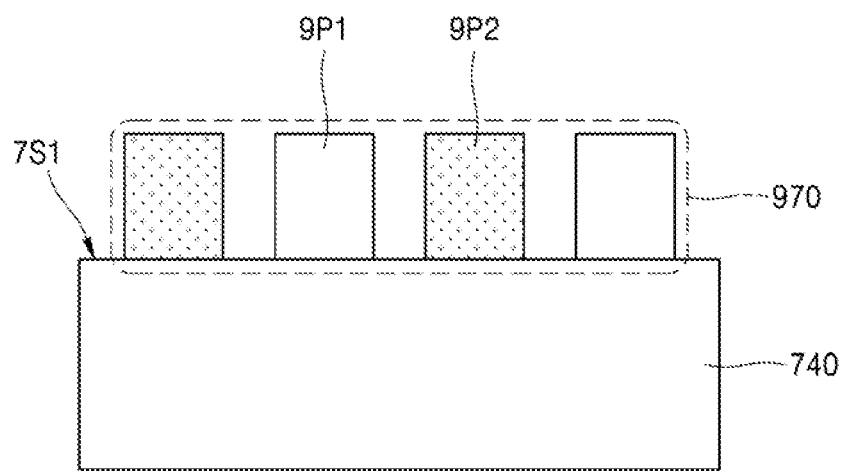
FIG. 10 is a cross-sectional view taken along line 10-10' of FIG. 9.

FIG. 9 is a plan view illustrating an example of the fourth coded mask layer 670 included in the sixth imaging system 600, and FIG. 10 is a cross-sectional view taken along line 10-10' of FIG. 9. Like reference numbers as the aforementioned reference numbers indicate like members.

Referring to FIGS. 9 and 10 together, a second meta-surface 970 is present on one surface 7S1 of a substrate 740. The second meta-surface 970 includes a plurality of first meta-patterns 9P1 and a plurality of second meta-patterns 9P2. One of the plurality of first and second meta-patterns 9P1 and 9P2 may be provided to change a phase of incident light, and the other may be provided to change an amplitude of the incident light. The plurality of first meta-patterns 9P1 may be amorphous silicon patterns, silicon nitride patterns, or titanium nitride patterns, and the data (dimensions) of each pattern 9P1 may be the same as the plurality of meta-patterns MP1 of FIG. 7, but is not limited thereto. The plurality of second meta-patterns 9P2 may be metal patterns. For example, the dimension of each of the plurality of second meta-patterns 9P2 may be the same as the dimension of each of the plurality of first meta-patterns 9P1, but may be different from each other. The plurality of first meta-patterns 9P1 and second meta-patterns 9P2 may be arranged so that a planar shape of the second meta-surface 970 is a square, but may not be a square. The plurality of first and second meta-patterns 9P1 and 9P2 may be distributed to have the same pitch as the pitch P1 of the plurality of meta-patterns MP1 of FIG. 7, but may be distributed to have different pitches. The plurality of first meta-patterns 9P1 may be positioned between adjacent ones of the plurality of second meta-patterns 9P2 in both the horizontal and vertical directions, and the plurality of second meta-patterns 9P2 may be positioned between adjacent ones of the plurality of first meta-patterns 9P1. For example, heights of the plurality of first meta-patterns 9P1 may be the same or substantially the same as each other, and heights of the plurality of second meta-patterns 9P2 may also be the same or substantially the same as each other. For example, the height of the first meta-pattern 9P1 may be the same as or substantially the same as the height of the second meta-pattern 9P2, but may be different from each other.

Next, a method of manufacturing an imaging system according to an example embodiment will be described with reference to FIGS. 11 to 14. Like reference numbers as the aforementioned reference numbers indicate like members.

Figure 11:
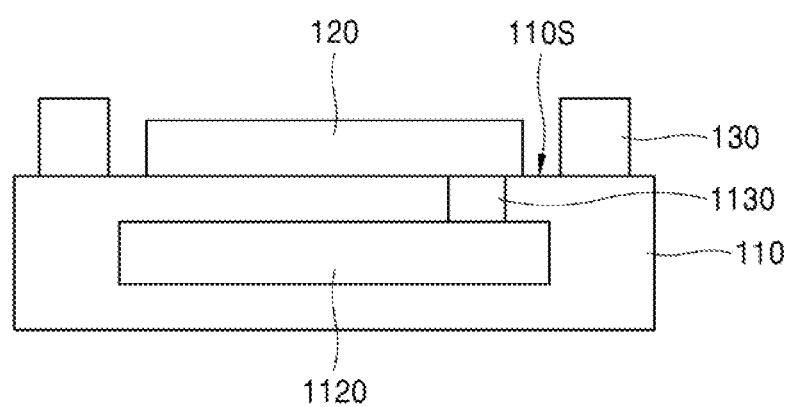
FIGS. 11 to 14 are plan views/cross-sectional views illustrating a method of manufacturing an imaging system according to an embodiment.

First, as shown in FIG. 11, first bumps 130 separated from each other are formed on one surface 110S of the substrate 110. A partial region of the one surface 110S of the substrate 110 may be defined by the first bumps 130. For example, the one surface 110S of the substrate 110 may be an upper surface of the substrate 110, but may be expressed as a bottom surface or a side surface depending on a viewpoint. The first bumps 130 are elements for bonding a member aligned on the substrate 110 to the substrate 110 in a subsequent process, and may be formed at the same height on the substrate 110. An image sensor 120 may be formed on an area of the one surface 110S of the substrate 110 defined by the first bumps 130. For example, after the image sensor 120 is first formed on the one surface 110S of the substrate 110, the first bumps 130 may be formed. For example, the image sensor 120 may be formed directly on the substrate 110 by using a deposition and/or growth method. For example, the image sensor 120 may be pre-formed outside the substrate 110, and then, mounted on the defined area of the one surface 110S of the substrate 110. For example, heights of the image sensor 120 and the first bumps 130 may be the same or different from each other. Before or after the image sensor 120 is formed on the one surface 110S of the substrate 110, a circuit unit 1120 for driving and controlling the image sensor 120 may be formed. For example, the circuit unit 1120 may be formed to be included in the substrate 110. For example, the circuit unit 1120 may be formed on the one surface 110S of the substrate 110. For example, the circuit unit 1120 may be formed on an area of the one surface 110S of the substrate 110 defined by the first bumps 130. A wiring 1130 for interconnection may be formed between the circuit unit 1120 and the image sensor 120.

For example, the wiring 1130 may be a conductive plug filling a via hole.

Figure 12:
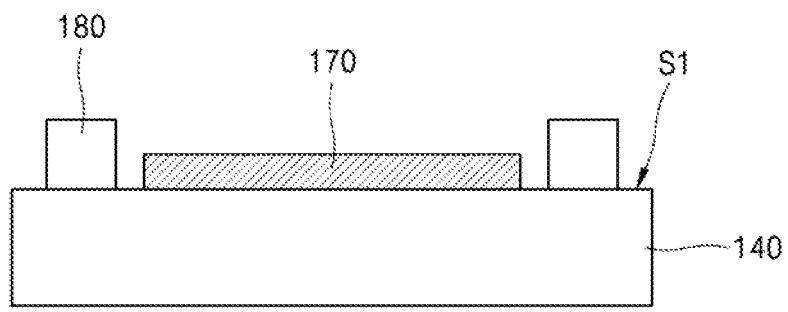

Next, after preparing a window layer 140 using a material transparent to visible light and/or LWIR rays, as shown in FIG. 12, a first coded mask layer 170 is formed on a first surface S1 of the window layer 140. For example, instead of the first coded mask layer 170, the third coded mask layer 470 of FIG. 5 may be formed. For example, instead of the first coded mask layer 170, the fourth coded mask layer 670 of FIG. 6 may be formed. For example, before the first coded mask layer 170 is formed, a transparent light separation layer (for example, 230 of FIG. 2) is first formed on the first surface S1 of the window layer 140, and the first coded mask layer 170 may be formed on the light separation layer 230. After the first coded mask layer 170 is formed, second bumps 180 may be formed on the first surface S1 of the window layer 140. The second bumps 180 may be formed to be separated from the first coded mask layer 170. For example, after the second bumps 180 are formed, the first coded mask layer 170 may be formed. For example, the second bumps 180 may be formed immediately before coupling (bonding) the window layer 140 to the substrate 110. The second bumps 180 may be formed at a position directly opposite to the first bumps 130 in the coupling.

Figure 13:
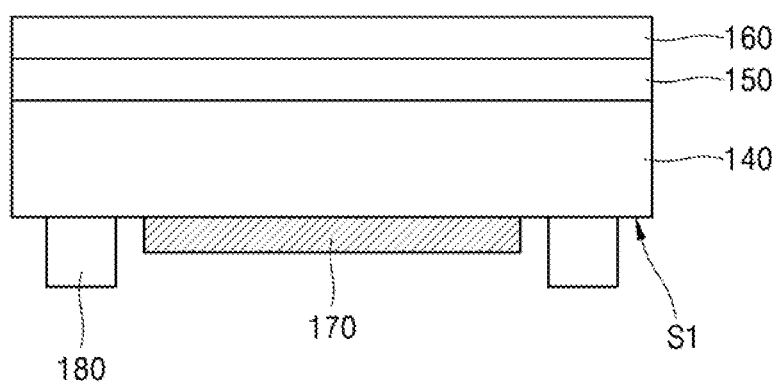

Next, as shown in FIG. 13, a filter layer 150 and an anti-reflection film 160 are sequentially stacked on a second surface S2 of the window layer 140. For example, the order of formation of the filter layer 150, the anti-reflection film 160, and the first coded mask layer 170 may be changed. The second surface S2 may be opposite to the first surface S1. When the first surface S1 is a bottom surface, the second surface S2 may be an upper surface, and vice versa. For example, before the filter layer 150 and the anti-reflection film 160 are formed, the second coded mask layer 370 of FIG. 3 or the third coded mask layer 470 of FIG. 4 may be formed on the second surface S2 of the window layer 140, and the filter layer 150 and the anti-reflection film 160 may be sequentially formed on the second coded mask layer 370 or the third coded mask layer 470.

For example, as in the case of FIG. 3, the phase modulation type coded mask layers 170 and 370 are formed on either surface of the window layer 140, that is, on the first and second surfaces S1 and S2, and in this case, when an amplitude modulation type coded mask layer is added, the amplitude modulation type coded mask layer may be formed on the filter layer 150 or the anti-reflection film 160.

For example, the coded mask layer formed on at least one surface of the window layer 140 may include a meta-surface (for example, 770 of FIG. 8) and a transparent layer that evenly covers the meta-surface. The transparent layer may protect the meta-surface. A material layer formed on the coded mask layer may be formed on the transparent layer. For example, instead of forming the transparent layer, a material layer (e.g., the filter layer 150) formed on the coded mask layer may be formed to cover the meta-surface while filling between the meta-patterns of the meta-surface.

Figure 14:
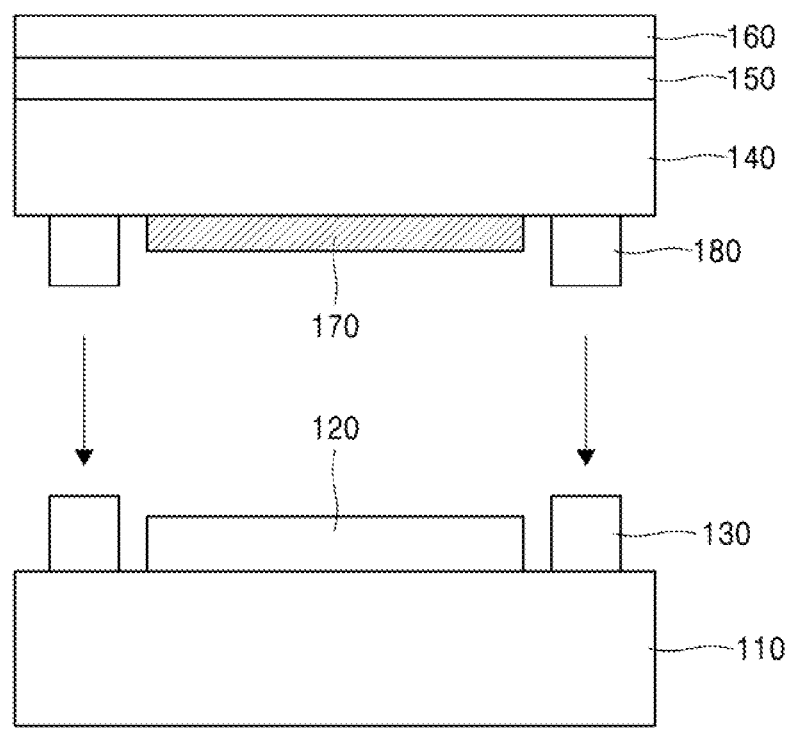

After the filter layer 150 and the anti-reflection film 160 are formed, as shown in FIG. 14, after aligning the window layer 140 and the substrate 110 so that the first bumps 130 and the second bumps 180 directly face each other, the substrate 110 and the window layer 140 are brought close to each other until the first and second bumps 130 and 180 contact each other in an aligned state. The first and second bumps 130 and 180 may be used as an alignment key (pattern) for the alignment. For example, in the aligned state, one of the substrate 110 and the window layer 140 (e.g., the substrate 110) may be fixed and the rest may be moved relative to the fixed one of the substrate 110 and the window layer 140 to adjust the contact between the first and second bumps 130 and 180. For example, the contact between the first and second bumps 130 and 180 may be adjusted in consideration of a distance between the image sensor 120 and the first coded mask layer 170 (refer to d1 in FIG. 1). When the distance (d1 in FIG. 1) between the image sensor 120 and the first coded mask layer 170 reaches a set value, the first and second bumps 130 and 180 that contact each other are melted. In this way, the substrate 110 and the window layer 140 are combined (coupled) to complete the imaging system (e.g., 100 in FIG. 1).

The above-described imaging systems may be applied to various electronic apparatuses, for example, smart phones, wearable devices, AR and VR devices, Internet of Things (IoT) devices, home appliances, tablet personal computers (PCs), personal digital assistants (PDAs), portable multimedia players (PMPs), navigations, drones, robots, unmanned vehicles, autonomous vehicles, advanced driver assistance systems (ADAS), etc.

Figure 15:
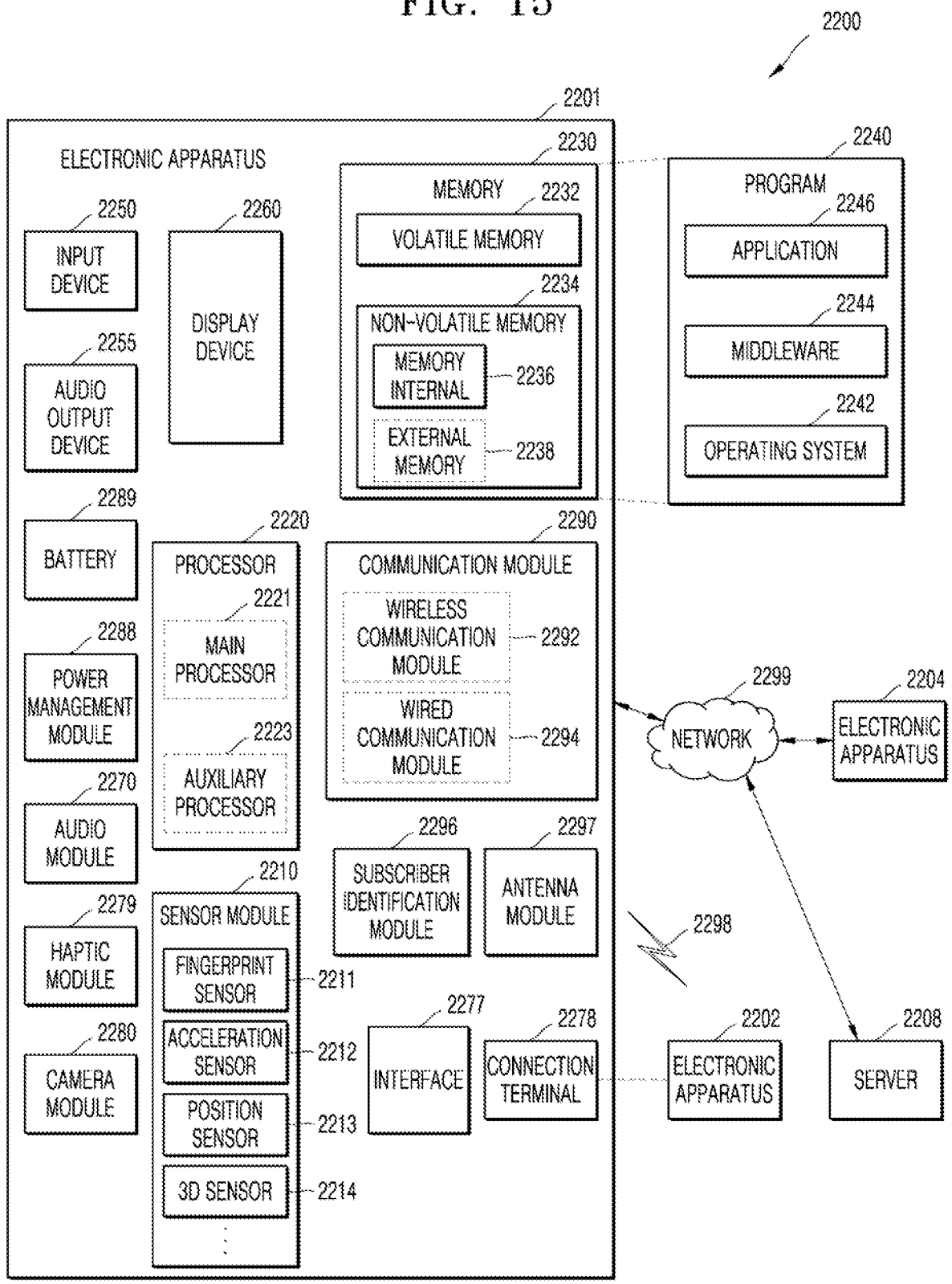
FIG. 15 is a block diagram illustrating an electronic apparatus according to an embodiment.

FIG. 15 shows a schematic configuration of an electronic apparatus 2201 according to an embodiment.

Referring to FIG. 15, an electronic apparatus 2201 in a network environment 2200 includes various devices and modules as shown.

A camera module 2280, which is one of the modules, may capture still images and moving images. For example, the camera module 2280 may include one of the first to sixth imaging systems 100, 200, 300, 400, 500 and 600 described above with reference to FIGS. 1 to 6. For example, the camera module 2280 may include a window assembly including at least one coded mask layer, image sensors, image signal processors, and/or flashes. The window assembly included in the camera module 2280 may collect light emitted from an object to be imaged, and the window assembly may correspond to the window assembly included in the imaging systems 100, 200, 300, 400, 500, and 600 described with reference to FIGS. 1 to 6.

A power management module 2288 may manage power supplied to the electronic apparatus 2201. The power management module 2288 may be implemented as a part of a power management integrated circuit (PMIC).

A battery 2289 may supply power to components of the electronic apparatus 2201. The battery 2289 may include a non-rechargeable primary cell, a rechargeable secondary cell, and/or a fuel cell.

A communication module 2290 establishes a direct (wired) communication channel and/or wireless communication channel between the electronic apparatus 2201 and other electronic apparatuses (electronic apparatus 2202, electronic apparatus 2204, server 2208, etc.), and may support communication performance through the established communication channel. The communication module 2290 may include one or more communication processors that are operated independently from the processor 2220 (an application processor, etc.) and may support direct communication and/or wireless communication. The communication module 2290 may include a wireless communication module 2292 (a cellular communication module, a short-range wireless communication module, a Global Navigation Satellite System (GNSS) communication module, etc.) and/or a wired communication module 2294 (a Local Area Network (LAN) communication module, a power line communication module, etc.). Among these communication modules, a corresponding communication module may communicate with other electronic apparatuses through a first network 2298 (a short-range communication network, such as Bluetooth, WiFi Direct, or Infrared Data Association (IrDA)) or a second network 2299 (a telecommunication network, such as a cellular network, the Internet, or a computer network (LAN, WAN, etc.). The various types of communication modules may be integrated into one component (single chip, etc.) or implemented as a plurality of components (plural chips) separate from each other. The wireless communication module 2292 may identify and authenticate the electronic apparatus 2201 by using subscriber information (International Mobile Subscriber Identifier (IMSI), etc.) stored in the subscriber identification module 2296 within a communication network, such as the first network 2298 and/or the second network 2299.

The antenna module 2297 may transmit or receive signals and/or power to and from the outside (other electronic apparatuses, etc.). The antenna module 2297 may include a radiator having a conductive pattern formed on a substrate (PCB, etc.). The antenna module 2297 may include one or a plurality of antennas. When a plurality of antennas are included, an antenna suitable for a communication method used in a communication network, such as the first network 2298 and/or the second network 2299 may be selected from among the plurality of antennas by the communication module 2290. Signals and/or power may be transmitted or received between the communication module 2290 and another electronic apparatus through the selected antenna. In addition to the antenna, other components (such as RFIC) may be included as a part of the antenna module 2297.

Some of the components may be connected to each other through communication methods between peripheral devices (bus, general purpose input and output (GPIO), serial peripheral interface (SPI), mobile industry processor interface (MIPI), etc.) and signals (commands, data, etc.) may be interchangeable.

Commands or data may be transmitted or received between the electronic apparatus 2201 and the external electronic apparatus 2204 through the server 2208 connected to the second network 2299. The other electronic apparatuses 2202 and 2204 may be the same type as or different type from that of the electronic apparatus 2201. All or part of operations executed in the electronic apparatus 2201 may be executed in one or more of the other electronic apparatuses 2202 and 2204 and the server 2208. For example, when the electronic apparatus 2201 needs to perform a function or service, the electronic apparatus 2201 may request one or more other electronic apparatuses to perform part or all of the function or service instead of executing the function or service itself. One or more other electronic apparatuses receiving the request may execute an additional function or service related to the request, and transmit a result of the execution to the electronic apparatus 2201. For this purpose, cloud computing, distributed computing, and/or client-server computing technologies may be used.

Figure 16:
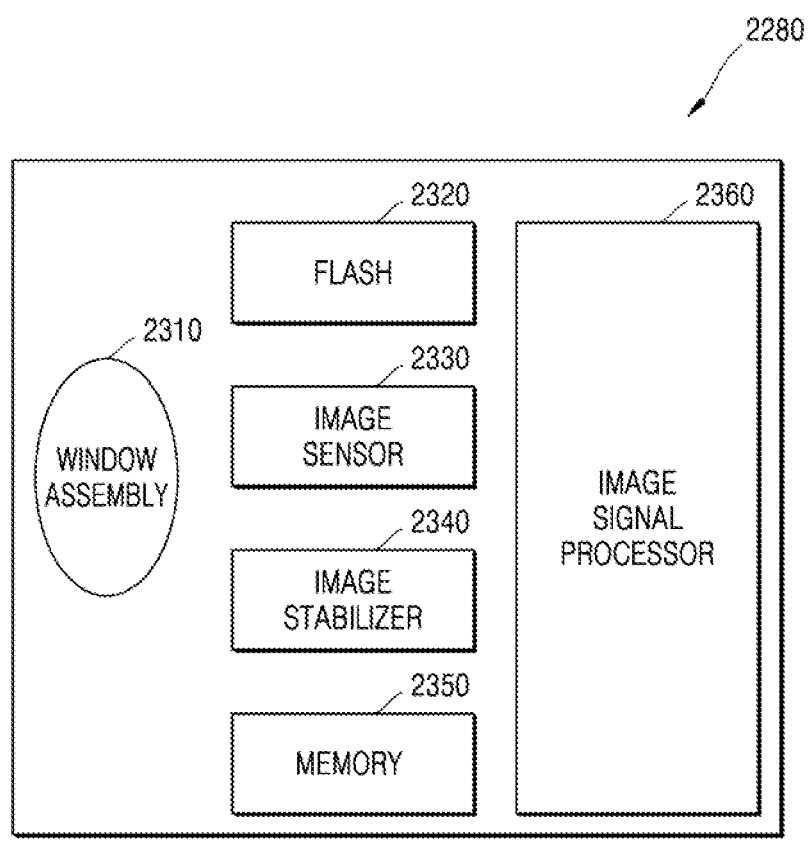
FIG. 16 is a block diagram illustrating a schematic configuration of a camera module included in the electronic apparatus of FIG. 15.

FIG. 16 is a block diagram illustrating a schematic configuration of a camera module included in the electronic apparatus of FIG. 15.

Referring to FIG. 16, the camera module 2280 may include a window assembly 2310, a flash 2320, an image sensor 2330, an image stabilizer 2340, a memory 2350 (buffer memory, etc.), and/or an image signal processor 2360. The window assembly 2310 may collect light emitted from an object to be imaged, and may include the window layer 140 described with reference to FIGS. 1 to 6, at least one coded mask layer (for example, 170 of FIG. 1), a filter layer 150, and an anti-reflection film 160.

The camera module 2280 may include a plurality of window assemblies 2310, and in this case, the camera module 2280 may be a dual camera, a 360 degree camera, or a spherical camera. Some of the plurality of window assemblies 2310 may have the same optical characteristics (angle of view, focal length, auto focus, F number, optical zoom, etc.) or may have different optical characteristics. The window assembly 2310 may include optical characteristics corresponding to a wide-angle lens or a telephoto lens.

The flash 2320 may emit light used to increase an intensity of light emitted or reflected from an object. The flash 2320 may include one or more light emitting diodes (red-green-blue (RGB) LED, White LED, Infrared LED, Ultraviolet LED, etc.), and/or a Xenon Lamp. The image sensor 2330 may acquire an image corresponding to an object by converting light emitted or reflected from the object and transmitted through the window assembly 2310 into an electrical signal. The image sensor 2330 may include the image sensor 120 described above.

The image stabilizer 2340 may compensate for a negative effect of movement by moving the window assembly 2310 or the image sensor 2330 in a specific direction or adjusting the operation characteristics (adjustment of read-out timing, etc.) of the image sensor 2330 in response to the movement of the camera module 2280 or the electronic apparatus 2201 including the same. The image stabilizer 2340 may detect the movement of the camera module 2280 or the electronic apparatus 2201 by using a gyro sensor (not shown) or an acceleration sensor (not shown) arranged inside or outside the camera module 2280. The image stabilizer 2340 may be optically implemented.

The memory 2350 may store some or all data of an image acquired through the image sensor 2330 for a subsequent image processing operation. For example, when a plurality of images are acquired at high speed, the acquired original data (Bayer-Patterned data, high-resolution data, etc.) are stored in the memory 2350, and after displaying only low-resolution images, the original data of the selected (user selection, etc.) images may be transmitted to the image signal processor 2360. The memory 2350 may be integrated into the memory 2230 of the electronic apparatus 2201 or may be configured as a separate memory that is operated independently. The memory 2350 may also include a restoration algorithm for an image restoration operation to be performed in the image signal processor 2360.

The image signal processor 2360 may perform one or more image processing on an image acquired through the image sensor 2330 or image data stored in the memory 2350. The processing of the one or more images may include generating a depth map, three-dimensional modeling, generating a panorama, extracting feature points, synthesizing an image, image restoration, and/or image compensation (noise reduction, resolution adjustment, brightness adjustment, blurring, sharpening, softening, etc). The image signal processor 2360 may perform controlling (exposure time control or readout timing control, etc.) on components (such as, the image sensor 2330) included in the camera module 2280. The images processed by the image signal processor 2360 may be stored back in the memory 2350 for further processing or provided to external components (memory 2230, display device 2260, electronic apparatus 2202, the electronic apparatus 2204, the server 2208, etc.) of the camera module 2280. The image signal processor 2360 may be integrated into the processor 2220 or configured as a separate processor that is operated independently from the processor 2220. When the image signal processor 2360 and the processor 2220 are separately configured from each other, an image processed by the image signal processor 2360 may be additionally processed by the processor 2220, and then, displayed through the display device 2260.

The electronic apparatus 2201 may include a plurality of camera modules 2280 each having different properties or functions. In this case, one of the plurality of camera modules 2280 may be a wide-angle camera, and the other may be a telephoto camera. Similarly, one of the plurality of camera modules 2280 may be a front camera and the other one may be a rear camera.

While many details are set forth in the foregoing description, they should be construed as illustrative of embodiments, rather than to limit the scope of the disclosure. Therefore, the scope of the disclosure should not be defined by the described embodiments, but should be determined by the technical spirit described in the claims.

The disclosed window assembly may include a coded mask layer (meta-surface) exhibiting optical properties equivalent to that of an optical lens of the related art on a surface of the window layer, thereby exhibiting optical properties equivalent to that of a lens or a lens assembly of an imaging system of the related art. Accordingly, when the disclosed window assembly is used, it is possible to be free from optical and spatial constraints or limitations that an existing optical lens or lens assembly should have. In addition, because the coded mask layer of the disclosed window assembly is provided directly on a surface of a window layer, the coded mask layer is not provided separately from a packaging of an imaging system, but may be provided integrally with the packaging.

Accordingly, an imaging system having a small thickness and a compact size may be implemented. Accordingly, the disclosed imaging system may implement a camera that is less constrained by a form factor in not only a small electronic apparatus including mobile phones, but also flexible electronic apparatuses, robots, automobiles, etc. It should be understood that embodiments described herein should be considered in a descriptive sense only and not for purposes of limitation.

Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A window assembly comprising:
a transparent window layer; and
a first coded mask layer provided on a first surface of the transparent window layer, the first coded mask layer having a first shape configured to change a first property of light passing through the window assembly,
wherein the entire of the first surface is flat and the first coded mask layer is in direct contact with the first surface.

2. The window assembly of claim 1, wherein the first coded mask layer comprises a meta-surface comprising a phase modulation meta-pattern.

3. The window assembly of claim 2, wherein the meta-surface further comprises an amplitude modulation meta-pattern.

4. The window assembly of claim 1, further comprising a second coded mask layer provided directly on a second surface of the transparent window layer, the second coded mask layer having a second shape configured to change a second property of the light passing through the window assembly.

5. The window assembly of claim 4, wherein both the first and second coded mask layers comprise phase modulation coded mask layers.

6. The window assembly of claim 5, wherein each of the first and second coded mask layers comprises a respective plurality of phase modulation meta-patterns.

7. The window assembly of claim 4, wherein one of the first and second coded mask layers comprises a phase modulation coded mask layer, and the other one of the first and second coded mask layers comprises an amplitude modulation coded mask layer.

8. The window assembly of claim 7, wherein the phase modulation coded mask layer comprises a plurality of phase modulation meta-patterns, and the amplitude modulation coded mask layer comprises a plurality of amplitude modulation meta-patterns.

9. The window assembly of claim 4, further comprising a filter layer and an anti-reflection film sequentially stacked on the second coded mask layer.

10. The window assembly of claim 9, wherein the first and second coded mask layers both comprise phase modulation coded mask layers, and an amplitude modulation coded mask layer is further provided on the second coded mask layer.

11. The window assembly of claim 4, wherein the transparent window layer is transparent to long-wavelength infrared (LWIR) rays, and the first coded mask layer comprises a plurality of meta-patterns that change a phase of the LWIR rays, and
wherein the plurality of meta-patterns are configured to restore an image included in the light passing through the window assembly.

12. The window assembly of claim 1, further comprising a filter layer and an anti-reflection film sequentially stacked on a second surface of the transparent window layer, the second surface being opposite to the first surface.

13. The window assembly of claim 1, wherein the transparent window layer is transparent to long-wavelength infrared (LWIR) rays, and the first coded mask layer comprises a plurality of meta-patterns that change a phase of the LWIR rays, and
wherein the plurality of meta-patterns are configured to restore an image included in the light passing through the window assembly.

14. The window assembly of claim 13, wherein the transparent window layer comprises a silicon layer, and the plurality of meta-patterns comprise an amorphous silicon pattern.

15. An imaging system comprising:
   the window assembly of claim 1 that does not comprise a lens; and
   an image sensor configured to receive light passing through the window assembly and generate an electrical signal for generating an image.

16. The imaging system of claim 15, wherein the image sensor comprises a complementary metal oxide semiconductor (CMOS) image sensor.

17. An electronic apparatus comprising the imaging system of claim 15, wherein the imaging system is configured to generate the image of an object.

\* \* \* \* \*